United States Patent [19]
Chang et al.

[11] Patent Number: 5,734,179
[45] Date of Patent: Mar. 31, 1998

[54] SRAM CELL HAVING SINGLE LAYER POLYSILICON THIN FILM TRANSISTORS

[75] Inventors: Kuang-Yeh Chang, Los Gatos; Yowjuang W. Liu, San Jose, both of Calif.

[73] Assignee: Advanced Micro Devices, Inc., Sunnyvale, Calif.

[21] Appl. No.: 570,881

[22] Filed: Dec. 12, 1995

[51] Int. Cl.$^6$ .......................... H01L 29/76; H01L 29/94; H01L 27/11
[52] U.S. Cl. .................. 257/67; 257/66; 257/69; 257/382; 257/383; 257/384; 257/903
[58] Field of Search .................. 257/66, 67, 69, 257/382, 383, 384, 903

[56] References Cited

U.S. PATENT DOCUMENTS

| | | | |
|---|---|---|---|
| 5,326,989 | 7/1994 | Muragishi | 257/67 |
| 5,336,914 | 8/1994 | Andoh | 257/368 |
| 5,468,662 | 11/1995 | Havemann | 257/67 |
| 5,521,860 | 5/1996 | Ohkubo | 257/903 |

OTHER PUBLICATIONS

Yamanaka et al., "Advanced TFT SRAM Cell Technology Using a Phase-Shift Lithography", IEEE Transactions on Electron Devices, vol. 42, No. 7, Jul. 1995.

*Primary Examiner*—Mahshid D. Saadat
*Assistant Examiner*—Valencia Martin Wallace

[57] ABSTRACT

A static metal oxide semiconductor random access memory (SRAM) having NMOS and thin film transistors (TFTs) formed from a single polysilicon layer, and a method for forming the same. The SRAM cell comprises a plurality of NMOS transistors and TFTs that are interconnected by a local interconnect structure. The single layer of poly is used to define the TFT bodies and gates of NMOS transistors in the SRAM cell. Each TFT comprises a single polysilicon layer comprising source gate and drain regions. During the fabrication process, exposed portions of the TFT polysilicon body and exposed regions of NMOS transistors react with a refractory metal silicide to form polycide and silicide regions, respectively. An amorphous silicon pattern also reacts with the refractory metal silicide to form a local interconnect structure connecting the silicided portions of the thin film transistors and the MOS transistors. This arrangement results in a TFT SRAM cell that can be implemented using simple fabrication techniques, such as single poly logic processes or ASIC processes.

27 Claims, 10 Drawing Sheets

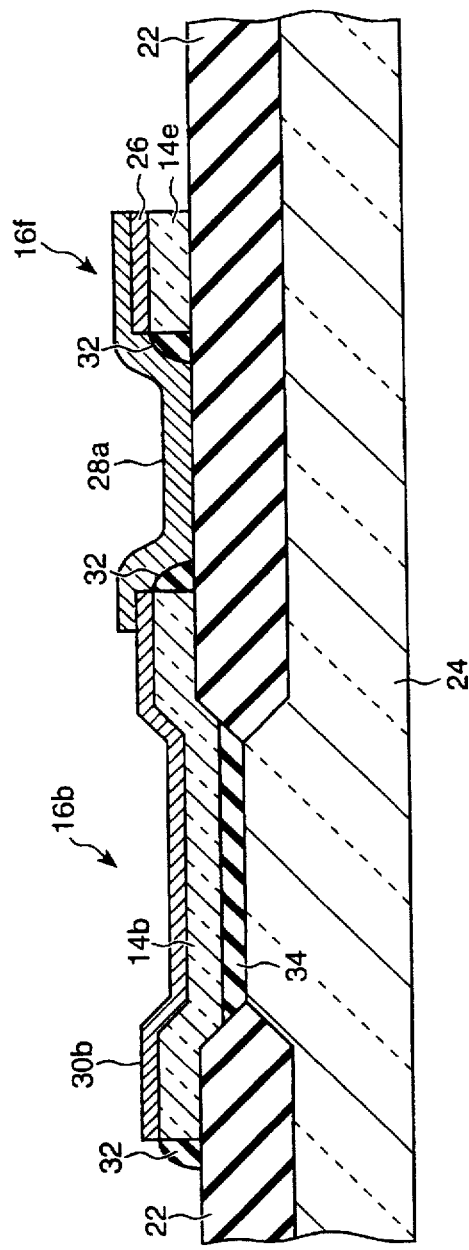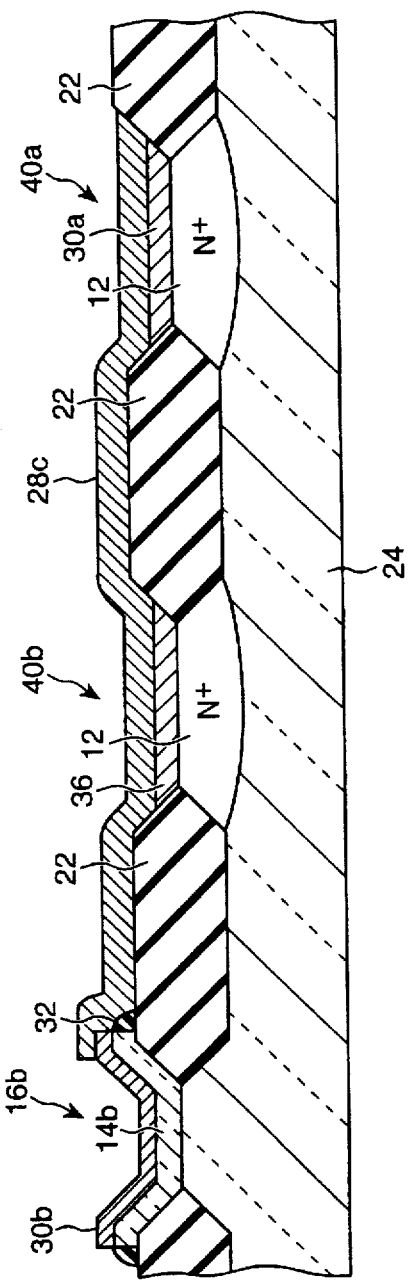
Fig. 4
Fig. 5

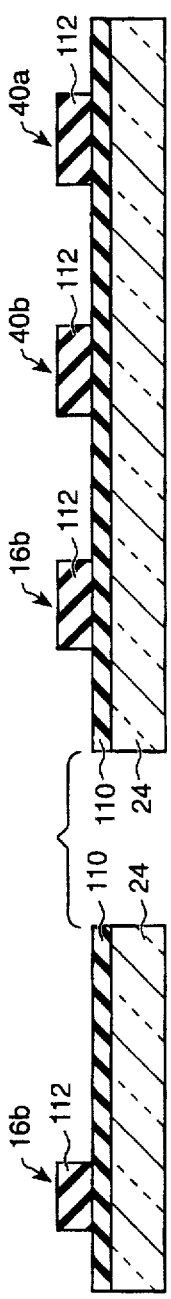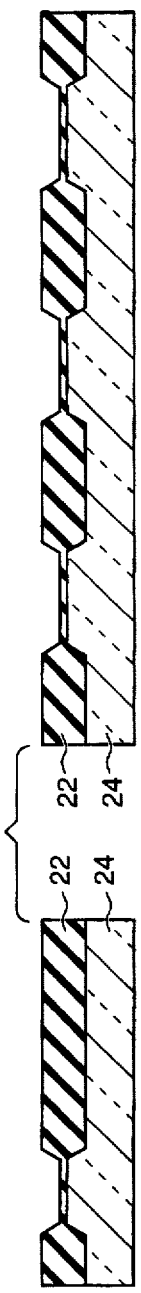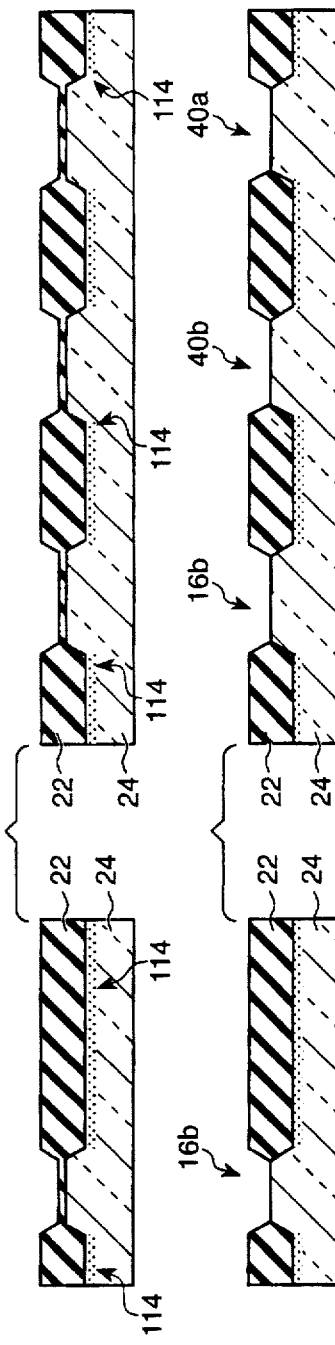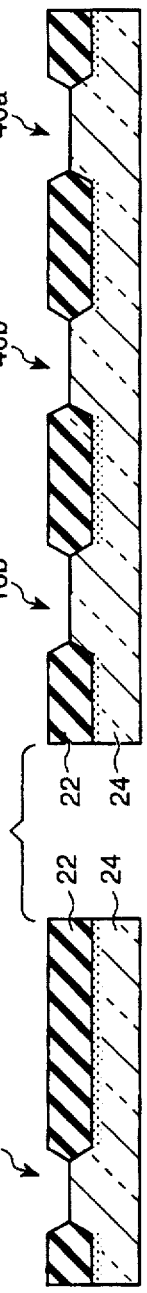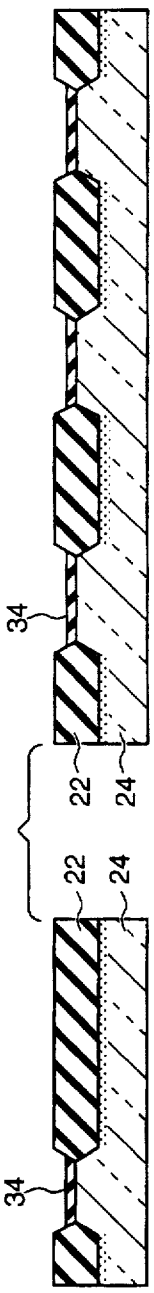

SRAM CELL HAVING SINGLE LAYER POLYSILICON THIN FILM TRANSISTORS

FIELD OF THE INVENTION

The present invention relates to static metal oxide semiconductor random access memory (SRAM) devices that use thin film transistors as load transistors and to the manufacture thereof.

DESCRIPTION OF THE RELATED ART

Metal oxide semiconductor (MOS) components are used to provide random access memory (RAM) devices operating in a static mode. These static RAM (SRAM) devices are typically implemented as a 4-transistor cell having two resistors or as a 6-transistor cell. An example of a 4-transistor SRAM cell is shown in FIG. 1A, with MOS transistors Q1 and Q4 which provide the gating or addressing of the SRAM cell and MOS transistors Q2 and Q3 in combination with load resistors R1 and R2 which form a bistable unit for storing a digital value. To read data from the SRAM cell in FIG. 1A, an address signal is supplied to set the gates of Q1 and Q4 to $V_{DD}$ (logic "1" for NMOS). If a "1" is stored in the SRAM cell, then Q3 is on and Q2 is off so that node N2 is at 0 volt and node N1 is at $V_{DD}$. In order to write a "1" into the SRAM cell, an address signal is supplied that sets the gates of Q1 and Q4 to $V_{DD}$, data line B is grounded and data line A is set to $V_{DD}$. Current now flows into the data line B through R2 and Q4 to effectively ground the node N2. This cuts off Q2, and node N1 rises to $V_{DD}$. Consequently, Q3 is held on and N2 is maintained at 0 volt. When the address is removed, turning off Q1 and Q4, a "1" has been written into the selected memory cell. The cell operates similarly to read or write a "0".

The 4-transistor cell shown in FIG. 1A typically uses polysilicon (poly) for the resistor loads R1 and R2. The MOS transistors of the 4-transistor cell are traditionally formed by doping the gates using a diffusion technique known as $POCL_3$.

Polysilicon resistors are intrinsic (i.e., undoped) devices. However, the MOS transistor gate is $POCL_3$ doped. Hence, the polysilicon resistors are typically implemented in a second polysilicon layer folded on top of the NMOS transistors. Thus, the 4-transistor cell of the prior art requires more than one polysilicon layer to form the polysilicon resistors. Moreover, the 4-transistor cell having polysilicon resistor loads is particularly sensitive to alpha ($\alpha$) particles affecting the intrinsic resistor material.

SRAM cells having six MOS transistors have been used as an alternative to the 4-transistor cell to avoid the fabrication of resistor R1, R2. As shown in FIG. 1B, the 6-transistor SRAM cell includes four NMOS transistors Q1–Q4, and two transistors Q5 and Q6 operating as load resistors that replace the resistors R1 and R2 of FIG. 1A. The transistors Q5 and Q6 are typically implemented as PMOS transistors.

One advantage of the 6-transistor SRAM cell is that the NMOS-PMOS arrangement can be formed using a single polysilicon layer. Another is that the 6-transistor SRAM cell having PMOS load transistors typically has a lower standby current than 4-transistor cells, requiring less power. In addition, the 6-transistor SRAM cell having PMOS load transistors is less sensitive than 4-transistor SRAM cells to alpha ($\alpha$) particles due to the use of active transistors. However, the 6-transistor SRAM cell, with its combined use of NMOS and PMOS transistors, is susceptible to latch-up.

Thin film transistors (TFTs) have been used in the 6-transistor SRAM cell in place of the PMOS transistors Q5 and Q6 in order to improve SRAM cell performance. Thus, referring again to the circuit diagram in FIG. 1B, the TFT SRAM cell in accord with this implementation provides transistors Q5 and Q6 as film transistors. An advantage of the TFT SRAM cell is in the high on/off ratio occassioned by the TFT-MOS combination. Moreover, the use of the TFT SRAM cell provides lower standby current, and higher resistance to $\alpha$ particles.

The implementation of thin film transistors (TFTs) in high density SRAM cells has conventionally required a minimum of three layers of polysilicon for fabricating the SRAM cells. This is because the bottom polysilicon layer is used to form the gates of the MOS transistors, a second polysilicon layer to form the TFT body, and a third polysilicon layer to form the TFT gates. In addition, a fourth polysilicon layer typically is used as an insulating layer for a transistor source $V_{SS}$ line. Consequently, the formation of high density SRAM cells using thin film transistors conventionally requires complex manufacturing processes. As processes such as the single polysilicon logic process or the application specific integrated circuit (ASIC) process cannot be used to manufacture the multiple poly layer SRAM cells, the implementation of the SRAM cell using thin film transistors has been extremely limited.

Thin film transistors in high density SRAM devices of three to four layers of polysilicon results in a complex structure that is more expensive to manufacture, and which results in a greater probability of defects. On the other hand, SRAM devices using poly resistors require at least two poly layers, with disadvantages of higher standby current and sensitivity to $\alpha$ particles.

SUMMARY OF THE INVENTION

In view of the foregoing, there is a need for a SRAM cell implemented with thin film transistors (TFTs) without requiring three to four layers of polysilicon (poly).

There is also a need for a method of forming a static random access memory cell of MOS transistors and thin film transistors with minimum complexity.

There is also a need for a high density SRAM cell using thin film transistors that provides a greater yield and reliability compared to existing manufacturing methods. There is also a need for a SRAM cell comprising TFTs that may be implemented using a single layer of poly.

These and other needs are met by the present invention, which provides a SRAM cell comprising a plurality of metal oxide semiconductor (MOS) transistors and thin film transistors. The metal oxide semiconductors are connected to the thin film transistors by a local interconnect structure to provide a TFT SRAM cell that can be implemented using a single layer of polysilicon. As a result, the TFT SRAM cell of the present invention can be manufactured using existing sub-micron logic processes. In addition, the use of a single poly layer in the TFT SRAM cell of the present invention results in reduced complexity, increasing manufacturing yield.

According to the present invention, a static random access memory (SRAM) cell comprises a group of metal oxide semiconductor (MOS) transistors each comprising a gate having a polysilicon layer, between and insulated from source and drain impurity regions formed in a semiconductor substrate. The SRAM cell also comprises at least one thin film transistor (TFT) comprising an insulating layer and a polysilicon body formed of the same polysilicon layer and disposed on the insulating layer. The polysilicon body comprises a gate region, and source and drain regions formed of a second impurity. The thin film transistor also comprises a conductive gate insulated from the gate region of the polysilicon body by a dielectric layer. The SRAM cell also comprises a local interconnect structure that connects at least one of the MOS transistors to the thin film transistor.

Further according to the present invention, the local interconnect structure is formed of silicide portions that connect the MOS transistors to the thin film transistor. The MOS transistors have silicide regions formed on the source and drain regions, and polycide regions formed at the MOS transistor gate. Further, the source and drain portions of the thin film transistor each include polycide regions. Thus, the local interconnect structure connects the metal oxide transistors to the thin film transistor by electrically interconnecting the respective silicide and polycide regions of the transistors.

The present invention also provides a method for forming a SRAM cell device having a single poly-layer thin film transistor. The method comprises the steps of forming a polysilicon pattern from polysilicon deposited on a field-oxidized silicon substrate, whereby the polysilicon pattern includes transistor gates and polysilicon bodies. The device is then implanted at portions of the field-oxidized silicon substrate with a first impurity to form source and drain regions for a first group of transistors, and the polysilicon bodies are then implanted with a second impurity to form source and drain regions for the second group of transistors. An oxide layer pattern is next formed exposing portions of the implanted field-oxidized silicon substrate and the polysilicon pattern. After depositing a refractory metal silicide on the oxide layer pattern, an amorphous silicon pattern is formed on the deposited refractory metal silicide. Heat is then applied to cause the deposited refractory metal silicide to react with the amorphous silicon pattern and the portions exposed by the oxide layer pattern to form local interconnect conducting regions.

Thus, the present invention provides an effective technique for providing a reliable, high density SRAM cell using only a single layer of polysilicon. As a result, the present invention can be implemented using sub-micron logic processes and ASIC processes. Moreover, the use of a single poly layer provides improved yield during the manufacturing process.

These and other advantages of the present invention become more readily apparent upon review of the attached drawings and the accompanying detailed description of the best mode for carrying out the invention.

BRIEF DESCRIPTION OF THE DRAWINGS

Reference is made to the attached drawings, wherein elements having the same reference numeral designations represent like elements throughout, and wherein:

FIG. 4 discloses a cross-section of a TFT gate connection to a MOS gate along lines II—II of FIG. 2.

FIG. 5 discloses a cross-section of a connection between a MOS gate and a MOS drain region via an overpass region along lines III—III of FIG. 2.

BEST MODE FOR CARRYING OUT THE INVENTION

According to the present invention, a static random access memory (SRAM) cell comprises a group of metal oxide semiconductor (MOS) transistors in combination with thin film transistors (TFTs) interconnected by a local interconnect structure. The local interconnect structure enables the thin film transistor to be formed of a single polysilicon layer, reducing the complexity of the SRAM fabrication process. A description will be given of an exemplary layout of the SRAM cell, followed by a description of the method for forming the SRAM cell.

Figure 1A:
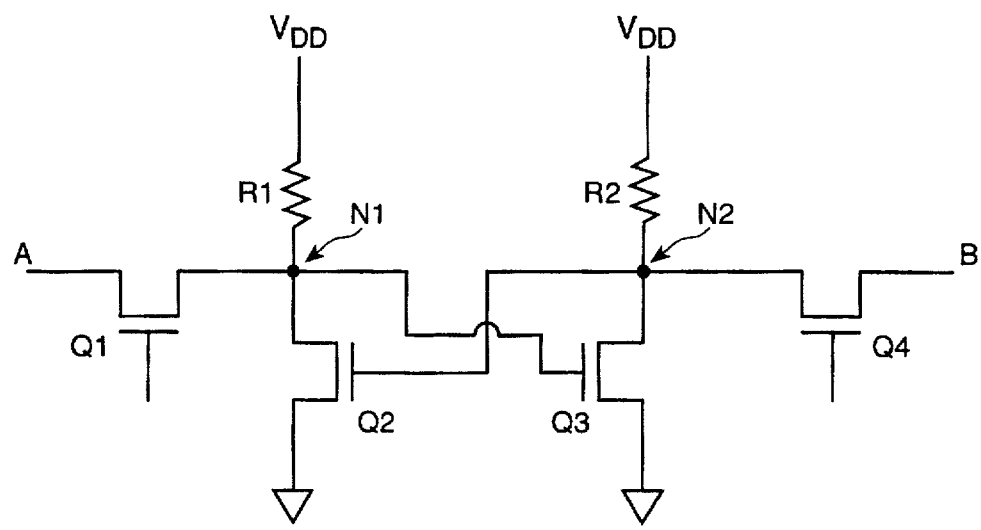
FIGS. 1A and 1B are circuit diagrams of a SRAM cell comprising polysilicon resistors and thin film transistors, respectively.
Figure 1B:
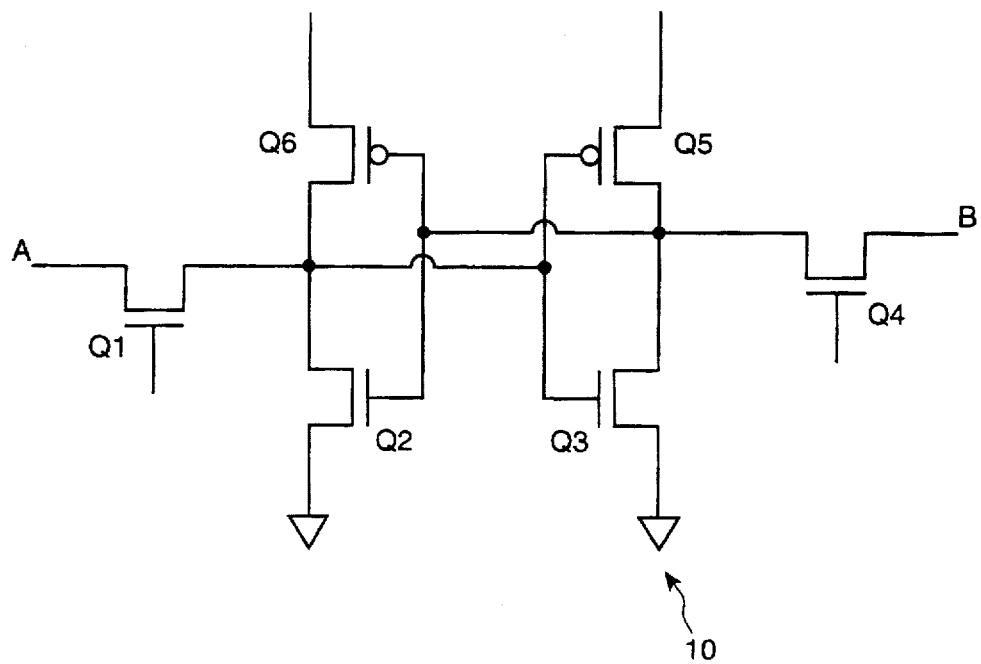
Figure 2:
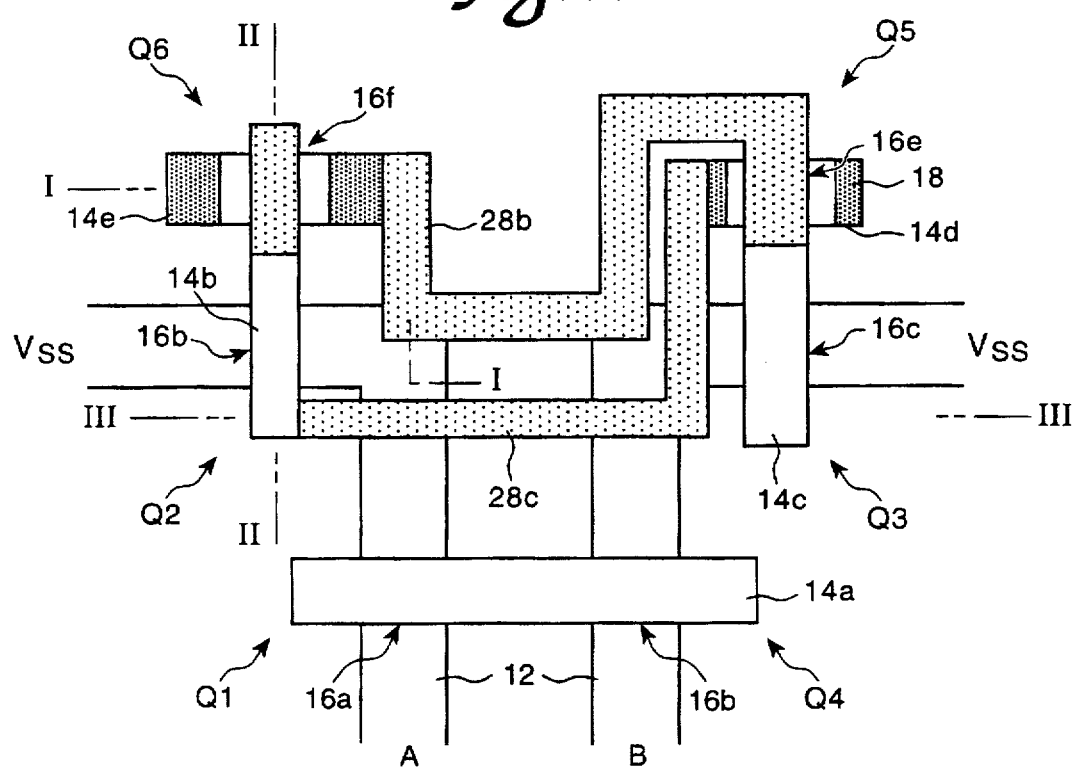
FIG. 2 is a layout diagram of an exemplary layout of the TFT SRAM cell according to a preferred embodiment of the present invention.

FIG. 2 is a layout diagram of a SRAM cell 10 having thin film transistors according to a preferred embodiment of the present invention. This layout is an example of the TFT SRAM cell 10 shown in FIG. 1B, implemented as a single poly layer; different layouts may be used consistent with the features of the claimed invention.

As shown in FIG. 2, the SRAM cell 10 comprises MOS transistors Q1, Q2, Q3 and Q4, and thin film transistors Q5 and Q6 corresponding to the circuit diagram in FIG. 1B. According to the preferred embodiment, the MOS transistors Q1–Q4 are NMOS transistors, although it will be appreciated that PMOS transistors may be used. Shown are an active layer 12, polysilicon (poly) layer 14, and local interconnect layer 16. One skilled in the art will appreciate that a detailed drawing of the accompanying field oxide layers, resistor protect layers, and metal layers is unnecessary for an understanding of the invention.

Referring to FIG. 2, the active layers 12 define the source and drain regions, as well as the channel regions, for the NMOS transistors Q1–Q4. The NMOS transistors Q1 and Q4 share a common polysilicon body 14a which divides the active layer 12 into the source and drain regions for the NMOS transistors Q1 and Q4. Although not shown in FIG. 2, each of the NMOS transistors preferably includes a P-channel region underneath NMOS gate 16. Thus, polysilicon body 14a forms NMOS gate 16a and 16d for transistors Q1 and Q4, respectively. Similarly, polysilicon body 14b forms NMOS gate 16b for NMOS transistor Q2, and polysilicon body 14c forms NMOS gate 16c for the NMOS transistor Q3. The transistors Q1 and Q4 are also connected to the A and B data lines, respectively (see FIG. 1B). Similarly, the transistors Q2 and Q3 are connected to $V_{SS}$ (ground potential).

Polysilicon bodies 14d and 14e are used to form thin film transistors Q5 and Q6, respectively. Specifically, thin film transistors Q5 and Q6 have a polysilicon body 14d and 14e, respectively, each having source and drain regions 18 that include P+ impurities implanted during formation of the TFT. The TFT gate regions 16e and 16f preferably include lightly-doped N– impurities.

Figure 3:
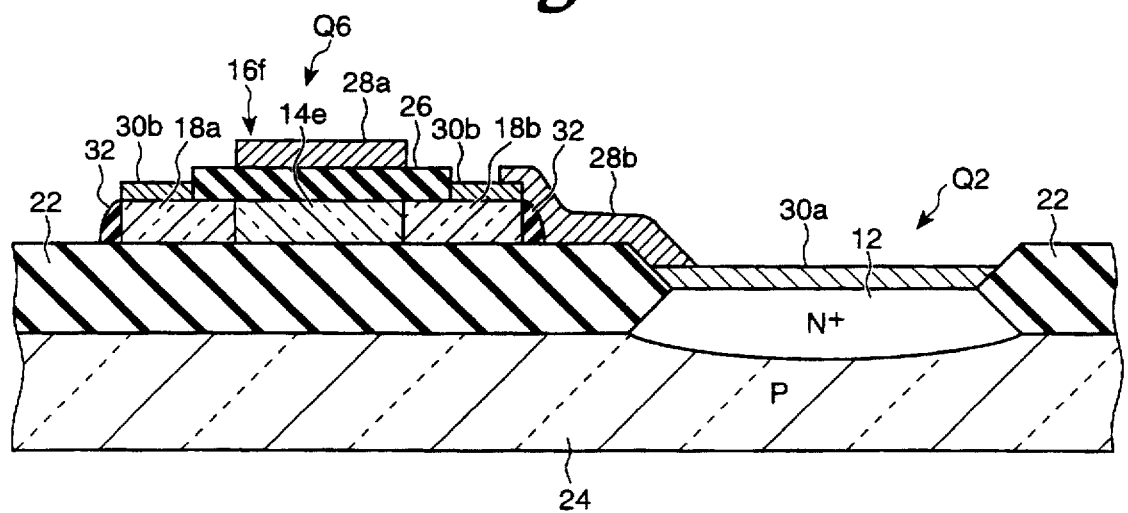
FIG. 3 discloses a cross-sectional view of a thin film transistor and a connection to a MOS drain along lines I—I of FIG. 2.

FIG. 3 shows a cross-section of the thin film transistor Q6 along lines I—I. The TFT source region 18a and the drain region 18b are spaced apart on the polysilicon body 14e, each region preferably being of P+ implanted impurity. The TFT gate region 16f is disposed between the source region 18a and the drain region 18b, and preferably includes an N– implanted impurity in the polysilicon body 14e. In addition, the polysilicon body 14e is formed on top of a field-oxidized layer 22 of a silicon substrate 24, preferably a P-type substrate. The field-oxidized layer 22 operates as an insulating layer and is formed, for example, as a locally-oxidized silicon (LOCOS) structure, well known in the art.

The TFT Q6 also comprises an insulating gate oxide layer 26, preferably a resistor protect dielectric, that electrically separates the polysilicon body 14e from a local interconnect portion 28a. As shown in FIGS. 2 and 3, the local interconnect portion 28a is used as a conductive gate for the gate 16f of the TFT transistor Q6, and as a local interconnect that electrically connects the gate 16f of TFT transistor Q6 to the gate 16b of the NMOS transistor Q2. A more detailed description of the local interconnect portion 28a is provided later with respect to FIG. 4.

As shown in FIG. 2, the SRAM device 10 includes three local interconnect portions 28a, 28b, and 28c. Local interconnect portion 28a connects the gate 16b of NMOS transistor Q2 to the gate 16f of the thin film transistor Q6. Local interconnect portion 28b electrically connects the drain 18b of the TFT transistor Q6 to both the drain of NMOS transistor Q2 and the gate 16e of the thin film transistor Q5. Local interconnect portion 28b also connects the gate 16e of the thin film transistor Q5 to the gate 16c of the NMOS transistor Q3. Local interconnect portion 28c connects the drain of the thin film transistor Q5 to both the drain of NMOS transistor Q3 and the gate 16b of NMOS transistor Q2. As discussed below with respect to FIG. 5, the local interconnect portion 28b and the local interconnect portion 28c comprise an overpass (not shown) that electrically isolates the local interconnect portion 28b and the local interconnect portion 28c from the drains of Q3 and Q2, respectively.

The local interconnect portions 28 are preferably formed of titanium silicide formed by rapid thermal annealing (RTA) of patterned amorphous silicon with titanium, described in more detail later. The local interconnect portions 28 are connected to silicide and polycide regions 30 formed by exposing portions of the transistors Q1–Q6 to the titanium and then performing the RTA. Thus, the local interconnect structure electrically connects the transistors Q1–Q6 to form a single poly-layer SRAM cell.

As shown in FIG. 3, the drain region of transistor Q2 includes a silicide formation 30a. In addition, the polysilicon layer 14e of the TFT Q6 comprises polycide regions 30b formed during the silicide process. The local interconnect portion 28b electrically connects the drain of the TFT transistor Q6 to the drain of the transistor Q2 by connecting the polycide region 30b of the TFT drain to the silicide region 30a of the drain of the NMOS transistor Q2. Similarly, the local interconnect portions 28 come in contact only with the corresponding silicide or polycide regions of the respective transistor. Thus, the local interconnect techniques of the present invention electrically connect different transistor devices by connecting corresponding silicide and polycide regions of the transistor using patterned silicide strips.

The thin film transistor Q6 also includes sidewall spacers 32 that electrically isolate the polycide body 14e from the local interconnect portion 28b formed of silicide. As described later, the spacer 32 is preferably etched oxide having a thickness preferably of up to 2,000 Å. Thus, the spacers 32 ensure that the local interconnect portion 28b comes into contact with the polycide region 30b and not the actual polysilicon body 14e.

FIG. 4 is a cross-section of the local interconnect portion 28a connecting the gate 16f of the TFT transistor Q6 to the gate 16b of the NMOS transistor Q2. The local interconnect portion 28a is used as the conductive gate of the gate 16f of the TFT transistor Q6. The insulating gate oxide layer 26, preferably a resistor protect dielectric, electrically separates the polysilicon body 14e and the local interconnect portion 28a. As mentioned earlier, the spacers 32 also electrically isolate the local interconnect portion 28a from the polysilicon body 14e.

The local interconnect portion 28a is laid out on the field-oxidized insulating layer 22 and electrically connects the gate 16f of the TFT transistor Q6 to the gate 16b of the NMOS transistor Q2. The gate 16b of the NMOS transistor Q2 comprises the polysilicon body 14b, which is separated from the substrate 24 by a gate oxide layer 34 disposed between the polysilicon body 14b and the silicon layer 24. According to the preferred embodiment, the channel region of the substrate 24 is doped with P– impurities. Thus, the doping of the P-type substrate 24 with P– impurities at the gate region 16b forms an NMOS transistor.

The gate 16b of the NMOS transistor Q2 comprises a polycide portion 30b formed on the polysilicon body 14b. Thus, the local interconnect portion 28a electrically connects the gate 16f of the TFT transistor Q6 to the gate 16b of the NMOS transistor Q2 by connecting the silicide gate 28a to the polycide portion of the gate 16b. Polysilicon body 14b is electrically separated from the local interconnect portion 28a by a spacer 32. Thus, the local interconnect portion 28a comes in contact only with the polycide portion 30b of the NMOS gate 16b.

FIG. 5 is a cross-section of the local interconnect portion 28c taken along lines III—III of FIG. 2. Gate region 16b of the NMOS transistor Q2 is electrically connected to a drain region 40a of NMOS transistor Q3 by the local interconnect portion 28c. Specifically, the local interconnect portion 28c is connected to the polycide portion 30b of the NMOS gate 16b. A spacer 32 electrically isolates the polysilicon body 14b from the local interconnect portion 28c. The local interconnect portion 28c is also connected to the silicide portion 30a of the N+ doped active region 12 corresponding to the drain region 40a of the NMOS transistor Q3.

The local interconnect portion 28c electrically connects the gate 16b of transistor Q2 to the drain 40a of transistor Q3 via an overpass region 36 disposed between the local interconnect portion 28c and a portion of the active layer 12 corresponding to the drain region 40b of transistor Q2. The overpass region 36, preferably formed of a resistor protect oxide or dielectric, covers the drain region 40b at the area passed by the local interconnect structure 28c, and thus electrically insulates the drain region 40b from the local interconnect structure 28c. Thus, the local interconnect portion 28c is able to cross over non-connected portions of the circuit, resulting in a simplified layout without the necessity of bypassing the active layer 12 by using a more complex bridge structure.

Figure 6A:
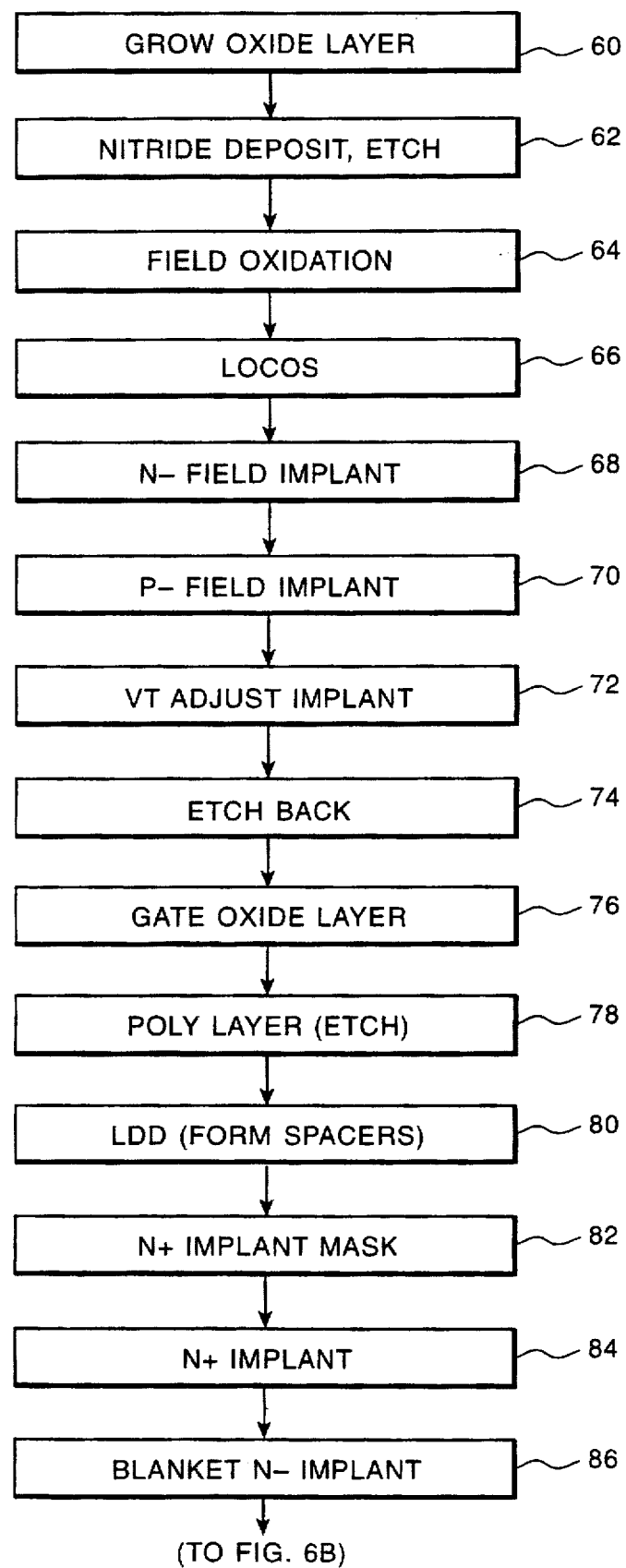
FIGS. 6A and 6B together form a flow diagram for a method of forming the single-poly TFT SRAM cell shown in FIG. 2 according to the preferred embodiment of the present invention.
Figure 6B:
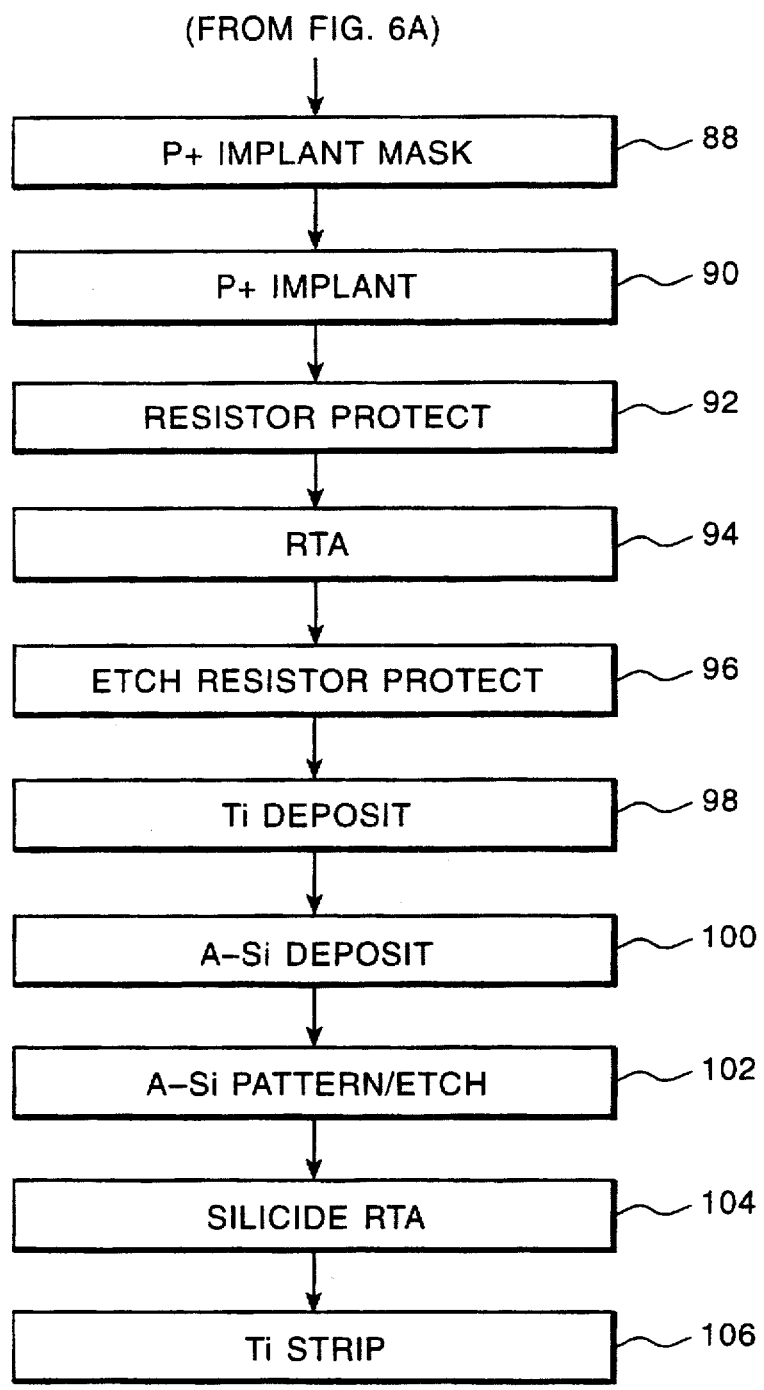
Figure 7G:
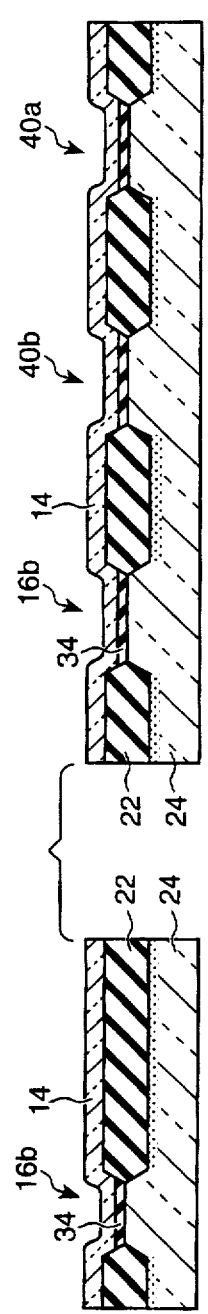
FIGS. 7A–7Q are sequence diagrams of the formation of the gate connections shown in FIGS. 4 and 5.
Figure 7H:
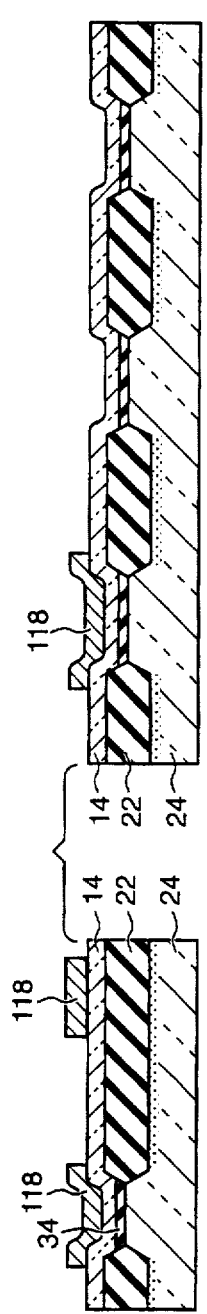
Figure 7I:
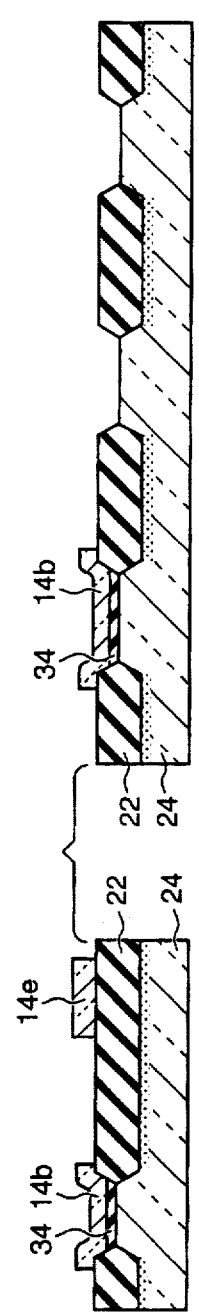
Figure 7J:
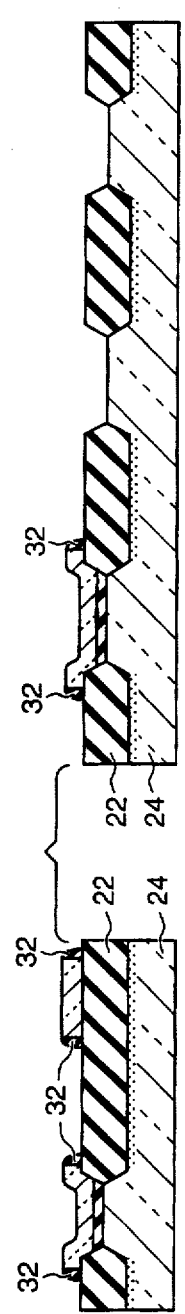
Figure 7K:
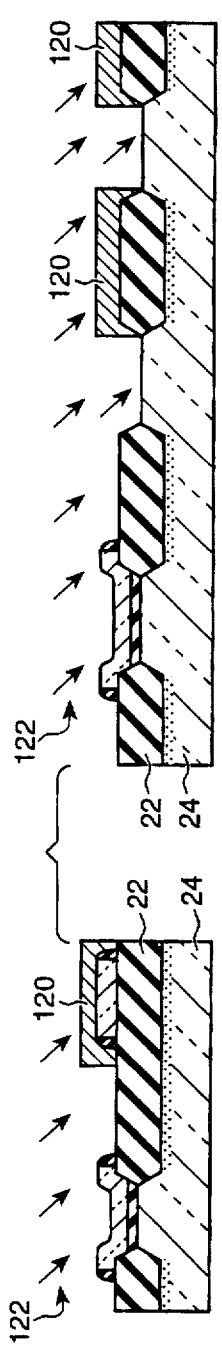
Figure 7L:
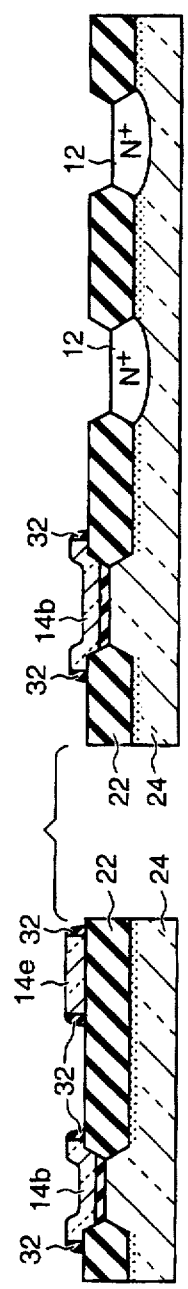
Figure 7M:
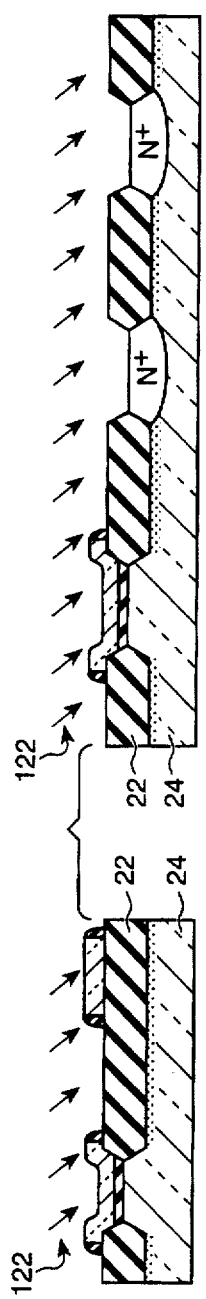

FIGS. 6A and 6B summarize a method of forming the single-poly TFT SRAM cell shown in FIGS. 2–5 according to the preferred embodiment of the present invention. The method enables the fabrication of a SRAM cell device having a single poly layer for the TFTs and the gates of the NMOS transistors. As a result, the process of the present invention can be implemented in existing single poly logic processes, as well as ASIC processes. FIGS. 7A–7Q are sequence diagrams showing the formation of the TFT SRAM cell of the present invention according to the method of FIGS. 6A and 6B.

As shown in FIG. 6A, the process of the present invention begins in step 60 by using a P-type silicon substrate 24 as starting material in order to form a LOCOS structure, where an oxide layer 110 with a thickness of about 200 Å is grown on the silicon substrate. FIG. 7A shows two views of the silicon substrate 24 and the oxide layer 110, the left view corresponding to the cross section II—II shown in FIG. 4, and the right view to the cross section III—III shown in FIG. 5. After formation of the oxide layer 110 in step 62, a nitride layer is deposited on the oxide layer 110 and etched to form a field oxidation mask 112. As shown in FIG. 7B, the field oxidation mask 112 will cover areas corresponding to the NMOS source-drain regions and the locations of the polysilicon bodies 14a, 14b, and 14c of the NMOS transistors Q1–Q4. After formation of the field oxidation mask 112, the oxide layer undergoes field oxidation in order to provide the field-oxidized layer 22 in step 64. Thus, after the nitride-etched field oxidation mask is removed in step 66, the result is a locally oxidized silicon structure (LOCOS), shown in FIG. 7C.

After the field-oxidized layer 22 is formed on the silicon substrate 24, an N-channel field implantation process is performed in step 68, whereby P– impurities 114 are implanted through the field oxide layer 22 as shown in FIG. 7D to isolate the NMOS transistors Q1–Q4 in step 68. Thereafter, an optional P-channel field implant may be performed in step 70 for field implantation of N– impurities for isolation of PMOS transistors that may be located elsewhere on the semiconductor substrate. As recognized by those skilled in the art, the field implantation steps 68 and 70 include the sub-steps of depositing and etching a photoresist mask that defines the N-channel and P-channel regions.

Following step 70, a voltage threshold (VT) adjust implantation is performed in step 72 to adjust the voltage characteristics of the NMOS transistors Q1–Q4, as well as any PMOS transistors that may be present on the silicon substrate. As shown in FIG. 7E, the field-oxidized layer 22 is selectively etched back in step 74 to expose the portions of the substrate 24 corresponding to the locations of the NMOS gates 16a–16d and the corresponding NMOS source and drain regions. Thereafter, a gate oxide layer 34 is grown for the gates 16a–16d of the NMOS transistors Q1–Q4 in step 76. A gate oxide layer 34 is formed as shown in FIG. 7F at the exposed regions of the substrate 24.

Figure 8:
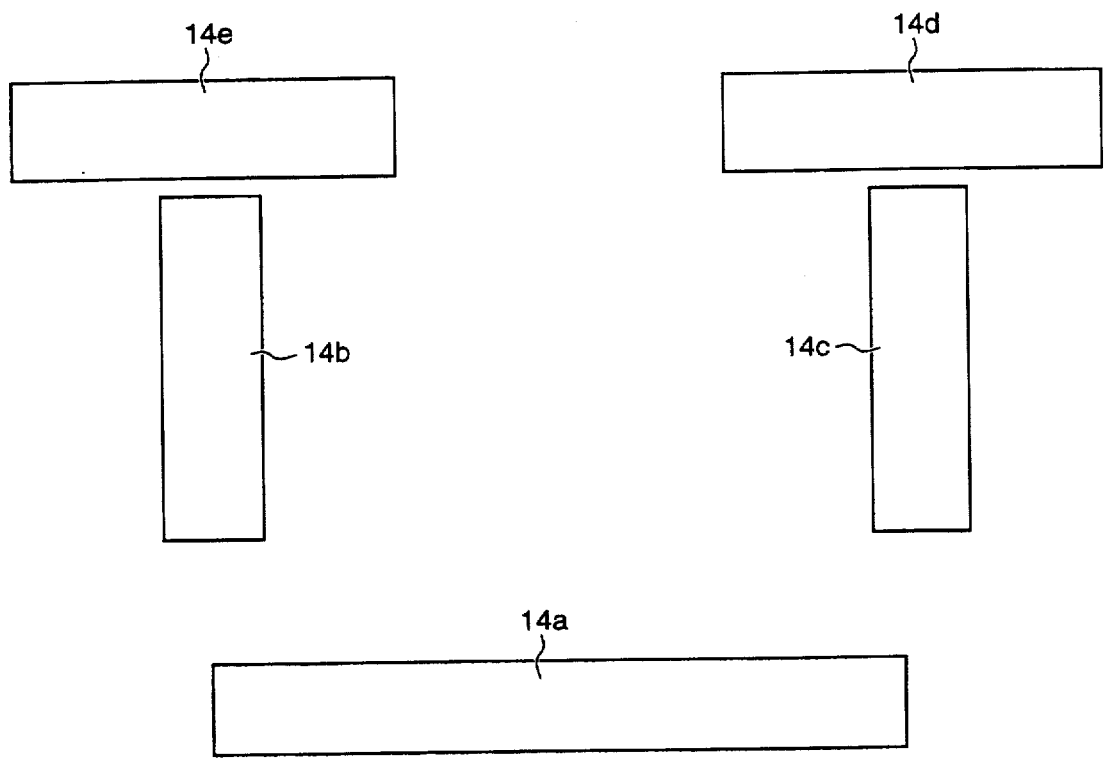
FIG. 8 is an illustration of a polysilicon layer after etching according to the process shown in FIGS. 6A and 6B.

After the gate oxide layer 34 has been formed in step 76, the polysilicon pattern is formed from a single deposited layer of polysilicon in step 78. Specifically, the polysilicon layer 14 is deposited on the field-oxidized silicon substrate to cover the field-oxidized regions 22 and the etched portions of the field-oxidized layer 22 as shown in FIG. 7G, including the gate oxide layer 34 and the exposed source-drain region for the NMOS transistors. The polysilicon layer thereafter is patterned using a poly etch process. Specifically, a photoresist layer is deposited and etched on the polysilicon layer to define a prescribed mask region 118 as shown in FIG. 7H and FIG. 8 corresponding to the polysilicon bodies for the TFT transistors and the NMOS transistor gates. After the poly mask 118 has been formed on the polysilicon layer, the exposed portions of the polysilicon layer are etched using a conventional poly-etch process. After the selective etching of the polysilicon layer, the photoresist poly mask 118 is removed, resulting in a layer of polysilicon that corresponds to the poly mask 118. Thus, the patterned polysilicon layer forms the polysilicon bodies 14a, and 14c for the NMOS transistors Q1–Q4 and the polysilicon bodies 14d and 14e for the TFT transistors Q5 and Q6. The resulting poly structure, shown in FIG. 7I, enables implementation of a TFT SRAM cell using a single layer of polysilicon.

After the polysilicon pattern has been formed in step 78, a low dose drain (LDD) process is performed to make the NMOS and any PMOS transistors less susceptible to hot electronic effects. During this process, the spacers 32 are also formed to electrically isolate the edges of the polysilicon bodies. Specifically, the LDD process in step 80 forms the spacers 32 by the process of depositing 1,000–2,000 Å of oxide, and selectively etching back the deposited oxide to form insulating spacers on the edge of the polysilicon as shown in FIG. 7J.

After the spacers 32 have been formed in step 80, an N+ implant mask 120 is formed in step 82 of photoresist to expose the source and drain regions of the NMOS transistors. As shown in FIG. 7K, the substrate 24 is implanted with N+ impurities 122 in step 84 to form the source and drain regions for the NMOS transistors at the exposed regions of the N+ implant mask 120. After formation of the source and drain regions of the NMOS transistors Q1–Q4, the photoresist mask 120 is removed, resulting in the structure shown in FIG. 7L. A blanket N– implant is performed in step 86 (without masking) to expose the poly regions and all the MOS devices as shown in FIG. 7M to a light concentration of N– impurities 122. As a result, the poly bodies 14a–14e are implanted with N– impurities.

Figure 9A:
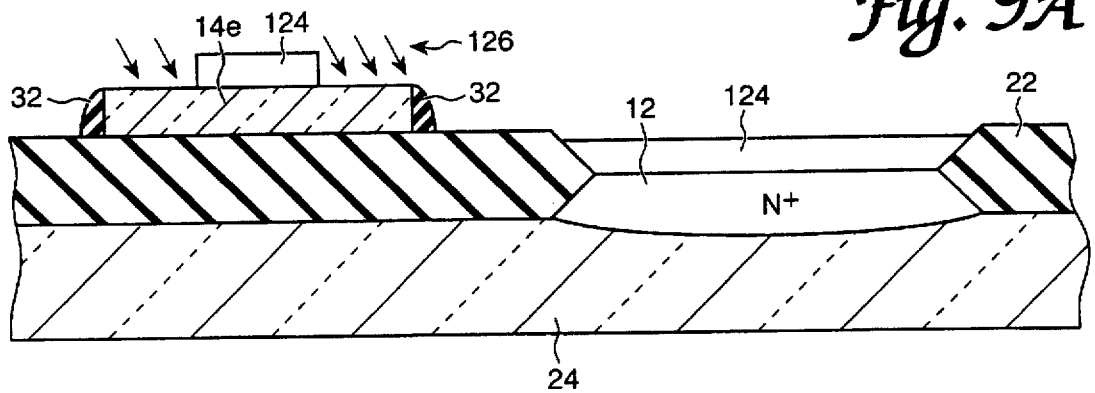
FIGS. 9A–9D are sequence diagrams of the formation of the TFT shown in FIG. 3.

The preferred method of the present invention continues as shown in FIG. 6B, where a P+ impurity mask 124 is formed from a photoresist layer in step 88 in order to define the source and drain regions of the thin film transistors Q5 and Q6, as well as any PMOS devices that may be present on the substrate 24. FIGS. 9A–9D are sequence diagrams of the formation of the TFT SRAM cell corresponding to the cross-section I—I shown in FIG. 3. As shown in FIG. 9A, the P+ impurity mask 124 exposes portions of the polysilicon layer 14 to receive P+ impurities 126. The exposed portions of the polysilicon bodies 14d and 14e receive the P+ implant impurities 126 to form the source and drain region 18a and 18b shown in FIG. 3 (step 90). The P+ mask is then removed, and a resistor protect oxide layer of 300 to 500 Å deposited (step 92). As discussed below with respect to step 96, deposited resistor protect oxide will be used in part to define the gate oxide 26 of the thin film transistors, as well as any overpass structures 36.

After the resistor protect oxide has been deposited in step 92, the field-oxidized silicon substrate, typically implemented as a semiconductor wafer, is placed in a furnace to undergo rapid temperature annealing (RTA) in step 94, whereby heat is applied to the structure to activate the implanted impurities. During the RTA process, the silicon structure is heated in an oxygen-free environment at a temperature within a range of 600° C. to 800° C. for a time period of between 40 to 60 seconds.

Figure 7N:
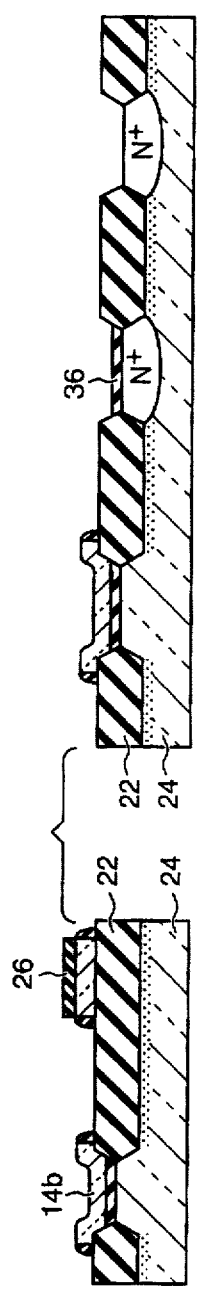
Figure 9B:
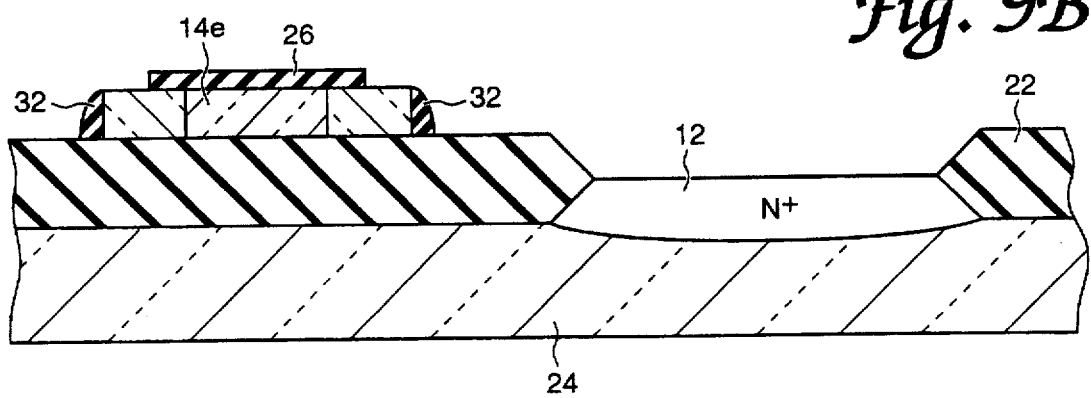

Following RTA, the resistor protect oxide layer 26 is etched away as shown in FIGS. 7N and 9B to expose any areas to be silicided in step 96. In other words, the resistor protect oxide is etched away in step 96 to form an oxide layer pattern exposing portions of the implanted source and drain portions of the field-oxidized silicon substrate and portions of the polysilicon bodies 14 in order to form the silicide regions 30a and polycide regions 30b, respectively.

At the same time, the resistor protect oxide is not etched away at areas requiring an insulating layer, such as the insulating gate oxide layer 26 of the TFT Q5 and Q6, and the overpass region 36. In addition, the resistor protect oxide will not be etched back at regions which define resistor patterns elsewhere in the substrate 24.

Figure 7P:
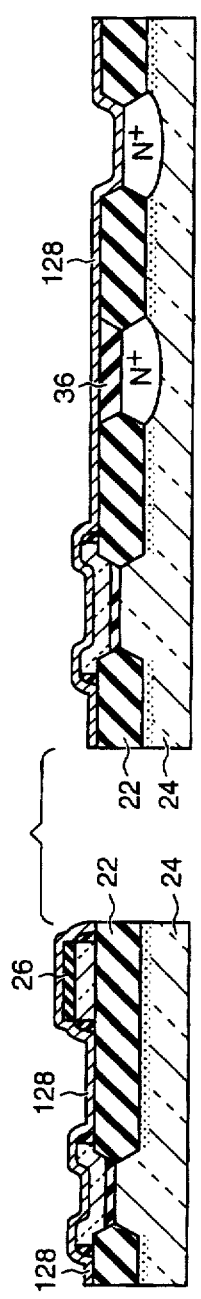
Figure 7Q:
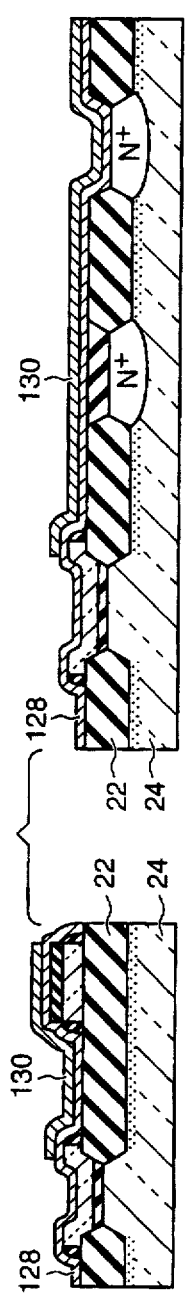
Figure 9C:
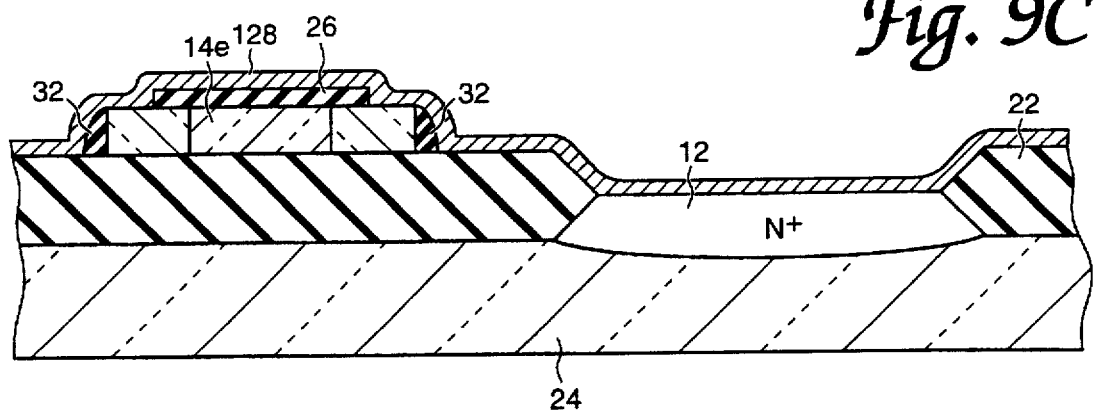

After the oxide layer pattern has been formed from the etched resistor protect oxide in step 96, a refractory metal silicide 128, such as titanium, is deposited (step 98) on the oxide layer pattern as shown in FIGS. 7P and 9C. The deposited titanium layer 128 covers the portions exposed by the oxide layer pattern, including the implanted portions of the field-oxidized silicon substrate and the polysilicon pattern.

Figure 9D:
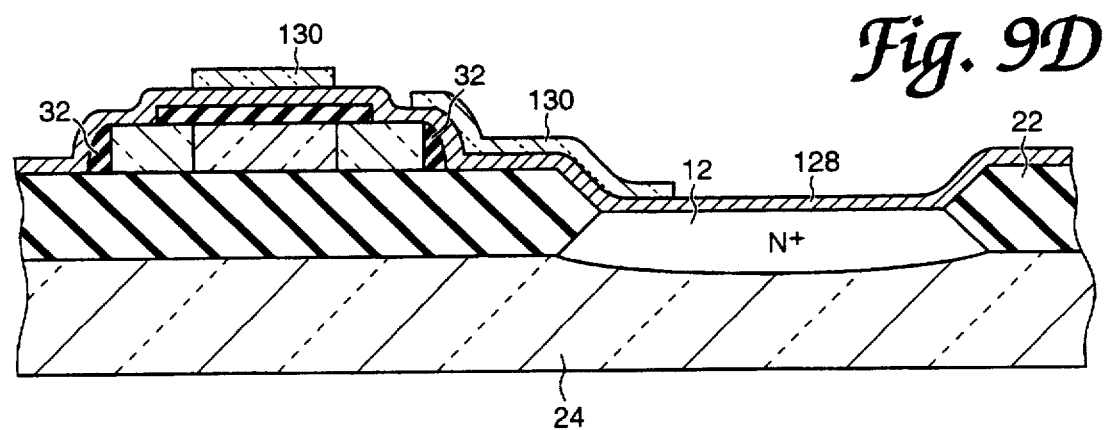

After the refractory metal silicide 128 has been deposited, a layer of amorphous silicon 130 is deposited over the titanium layer (step 100). The deposited amorphous silicon layer 130 is patterned in step 102 using a mask/etch process to form an amorphous silicon pattern corresponding to the local interconnect structure 28 including the local interconnect portions 28a, 28b and 28c. Portions of the amorphous silicon pattern 130 are shown in FIGS. 7Q and 9D.

After the amorphous silicon pattern 130 has been formed on the deposited refractory metal silicide (Ti), a silicide RTA process is performed in step 104. As will be recognized by those skilled in the art, during the RTA process, the high temperature (600°–800° C.) causes the silicon and polysilicon to react with the titanium within a very short time period, between 40–60 seconds, whereby the relatively short heating process ensures that the other areas of the semiconductor wafer are not adversely affected. During step 104, the titanium layer 128 will react with the amorphous silicon pattern 130 to form the local interconnect portions 28. In addition, the titanium layer 128 will react with exposed portions of the N+ implanted regions 12 to form the silicide region 30a, such as shown in FIGS. 3 and 5. Finally, the titanium layer 130 will react with the exposed polysilicon layer 14 to form polycide regions 30b for the NMOS gates such as gate 16b shown in FIGS. 4 and 5, and the source and drain regions of the TFT transistor Q6 shown in FIG. 3. Thus, the silicide RTA process in step 104 forms the first conducting regions defined by the amorphous silicon pattern and second conducting regions defined by the portions exposed by the oxide layer pattern formed in step 96. The titanium will not react in areas where there is no silicon (such as regions covered by the resistor protect oxide 26) or field-oxidized regions 22 covering the substrate 24. Thus, the silicide RTA process in step 104 forms the local interconnect structures in one step using two different separate pattern techniques.

Following the silicide RTA step in step 104, the titanium is stripped from the structure in step 106 using a wet etch in order to remove any free (i.e., unbonded) titanium. The titanium which bonded with the silicon or polysilicon is not removed by the titanium strip. The titanium strip in step 106 results in the TFT SRAM cell shown in FIGS. 2–5.

As described above, the present invention provides a SRAM cell formed of a single polysilicon layer, with metal oxide semiconductor transistors and thin film transistors, together with a local interconnect structure for connecting the MOS transistors to the TFTs. The ability to fabricate a SRAM cell having a single poly layer results in reduced manufacturing complexity, increasing manufacturing yield. Moreover, the method of the present invention provides improved flexibility during fabrication by enabling formation of the local interconnect structure in a single silicide RTA step using two formed patterns that react simultaneously with the refractory metal silicide. Thus, the present invention provides the advantageous features of TFT SRAM cell devices without the disadvantages of multiple poly layer fabrication processes.

Although the preferred embodiment is disclosed with respect to a plurality of NMOS devices, it will be appreciated that the above-described techniques may be equally applicable to other MOSFET devices, including PMOS. In addition, the present invention may be used to form different interconnect layouts, as desired.

It will also be appreciated that while the preferred embodiment uses dopants such as phosphorous and boron, different dopants may be used to form the single poly TFT SRAM cell of the present invention. In addition, although titanium is disclosed as the preferred element performing the silicide and polycide structures, it will be appreciated that other refractory metal silicides may be used to provide the conducting regions.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An integrated circuit formed on a semiconductor substrate, comprising:

a plurality of metal oxide semiconductor (MOS) transistors each comprising:

source and drain regions formed of a first impurity in the semiconductor substrate, and a first conductive gate formed of a polysilicon layer overlying and insulated from said source and drain regions;

at least one thin film transistor (TFT) comprising:

an insulating layer, a polysilicon body formed of said polysilicon layer and disposed on said insulating layer, said polysilicon body comprising source, gate and drain regions, the polysilicon source and drain regions containing a second impurity, a second conductive gate between said polysilicon source and drain regions, and a dielectric layer disposed between said second conductive gate and said polysilicon body; and a local interconnect structure formed from a reaction between silicon deposited between at least one of said MOS transistors and said at least one TFT and a refractory metal silicide and interconnecting said at least one of said MOS transistors and said at least one TFT.

2. An integrated circuit as recited in claim 1, wherein the gates of said MOS transistors further comprise polycide and said conductive TFT gate comprises silicide, said local interconnect structure comprising a first interconnect portion electrically connecting said conductive TFT gate to the gate of a first of said MOS transistors.

3. An integrated circuit as recited in claim 2, wherein said first interconnect portion consists essentially of silicide formed from a reaction between said refractory metal silicide and a patterned amorphous silicon.

4. An integrated circuit as recited in claim 2, wherein the drain region of said at least one TFT comprises polycide formed from said refractory metal silicide and the drain region of the first MOS transistor comprises silicide formed from said refractory metal silicide, said local interconnect structure further comprising a second interconnect portion electrically connecting the polycide of said at least one TFT drain region to the silicide of said drain region of said first MOS transistor.

5. An integrated circuit as recited in claim 4, wherein said local interconnect structure further comprises a third interconnect portion, the integrated circuit further comprising a dielectric overpass insulating said third interconnect portion from said drain region of said first MOS transistor.

6. An integrated circuit as recited in claim 5, further comprising a second TFT, the drain region of said second TFT comprising polycide electrically connected to said third interconnect portion.

7. An integrated circuit as recited in claim 6, wherein the second conductive gate of said second TFT is electrically connected to said second interconnect portion.

8. An integrated circuit as recited in claim 7, further comprising a second dielectric overpass, said second interconnect portion electrically connecting said at least one TFT to said second TFT via said second dielectric overpass.

9. An integrated circuit as recited in claim 1, wherein said local interconnect structure comprises a conductive connection portion, the integrated circuit further comprising a dielectric overpass insulating said conductive connection portion from a first portion of a first of said MOS transistors.

10. An integrated circuit as recited in claim 1, wherein said integrated circuit is a static random access memory cell and each of said MOS transistors are NMOS transistors, said first impurity consisting essentially of N+ impurities.

11. An integrated circuit as recited in claim 10, wherein said second impurity consists essentially of P+ impurities.

12. An integrated circuit as recited in claim 11, wherein said gate region contains N– impurities.

13. An integrated circuit as recited in claim 1, wherein the gate of each of said MOS transistors further comprises a gate oxide layer disposed between said polysilicon layer and the semiconductor substrate, said semiconductor substrate implanted with said first impurity at areas corresponding to said source and drain regions.

14. An integrated circuit as recited in claim 13, wherein said insulating layer is a field oxide layer grown on the semiconductor substrate.

15. An integrated circuit on a silicon substrate, comprising:

first and second thin film transistors (TFTs) each comprising:

a polysilicon body formed of a polysilicon layer, said polysilicon body disposed on an insulating layer formed from said silicon substrate and comprising source and drain regions, each of a first impurity implanted into said polysilicon body, and a gate region between the source and drain regions, a gate conductor between the source and drain regions of said polysilicon body, and an insulating portion between said gate region and said gate conductor;

metal oxide semiconductor (MOS) transistors each comprising:

source and drain regions of a second impurity formed in said silicon substrate, a gate formed of said polysilicon layer, and a gate oxide formed on said silicon substrate and disposed between said polysilicon gate and said silicon substrate; and local interconnecting portions formed from a reaction between silicon deposited between respective regions of said MOS transistors and said first and second TFTs and a refractory metal silicide and connecting said first and second TFTs to said MOS transistors.

16. An integrated circuit as recited in claim 15, wherein the gates of said MOS transistors further comprise polycide formed from said polysilicon layer and said gate conductor of said first and second TFTs comprises silicide, said local interconnecting portions comprising a first interconnect portion electrically connecting said gate conductor of said first TFT to the gate of a first of said MOS transistors.

17. An integrated circuit as recited in claim 16, wherein the drain region of said first and second TFTs comprises polycide and the drain region of the first MOS transistor comprises silicide, said local interconnecting portions further comprising a second interconnect portion electrically connecting the polycide of said first TFT drain portion to the silicide of said drain region of said first MOS transistor.

18. An integrated cirucit as recited in claim 17, wherein said local interconnect portions further comprising a third interconnect portion, the integrated circuit further comprising a dielectric overpass insulating said third interconnect portion from a portion of said drain region of said first MOS transistor, said third interconnect portion electrically connecting said gate of said first MOS transistor to a second of said MOS transistors via said dielectric overpass.

19. An integrated circuit as recited in claim 18, wherein the polycide of said drain portion of said second TFT is electrically connected to said third interconnect portion.

20. An integrated circuit as recited in claim 19, wherein the gate conductor of said second TFT is electrically connected to said second interconnect portion.

21. An integrated circuit as recited in claim 20, wherein said integrated circuit is a static random access memory cell, the integrated circuit further comprising a second dielectric overpass, said second interconnecting portions electrically connecting said first TFT to said second TFT via said second dielectric overpass.

22. An integrated circuit comprising:

a first group of transistors each comprising:

a silicon substrate, a field oxidized layer formed on said silicon substrate;

a transistor gate formed of a polysilicon layer overlying a first exposed region of said field oxidized layer, and source and drain regions formed at respective second and third exposed regions of said field oxidized layer, each containing a first impurity implanted into said silicon substrate;

a second group of thin film transistors each comprising:

a polysilicon body formed of said polysilicon layer and disposed on said field oxidized layer, said polysilicon body comprising a source and drain region each containing a second implanted impurity, and a gate region containing a third implanted impurity, a gate conductor overlying said polysilicon gate region, and an insulating layer disposed between said polysilicon body and said gate conductor; and a local interconnect pattern formed of a reaction between silicon deposited between respective regions of said first and second group of transistors and a refractory metal silicide and connecting said second group of transistors to said first group of transistors.

23. An integrated circuit as recited in claim 22, further comprising an overpass insulating layer disposed between a portion of said local interconnect pattern and at least one of said source and drain regions of said first group of transistors.

24. An integrated circuit as recited in claim 22, wherein said local interconnect pattern consists essentially of silicide formed from rapid thermal annealing of said refractory metal silicide and deposited amorphous silicon.

25. An integrated circuit as recited in claim 24, wherein said polysilicon body and said transistor gates of said first group of transistors each comprise polycide regions formed during said rapid thermal annealing.

26. A static random access memory (SRAM) cell on a silicon substrate, comprising:

first and second load transistors each comprising:

a polysilicon body formed of a polysilicon layer, said polysilicon body disposed on an insulating layer formed from said silicon substrate and comprising source and drain regions each of a first impurity implanted into said polysilicon body and a gate region between the source and drain regions, a gate conductor between the source and drain regions of said polysilicon body, and an insulating portion between said gate region and said gate conductor;

first, second, third, and fourth metal oxide semiconductor (MOS) transistors, said first and second MOS transistors providing access to nodes of the SRAM cell in response to an address signal, each of said MOS transistors comprising:

source and drain regions of a second impurity formed in said silicon substrate, a gate formed of said polysilicon layer, and a gate oxide formed on said silicon substrate and disposed between said polysilicon gate and said silicon substrate, the gates of said first and second MOS transistors receiving said address signal; and a local interconnecting structure formed from a reaction between silicon deposited between respective regions of said third and fourth MOS transistors and said first and second load transistors and a refractory metal silicide, comprising:

a first local interconnecting portion electrically connecting the gate of the third MOS transistor to the drain of the fourth MOS transistor, the gate of the first load transistor and the drain of the second load transistor to form a first of the nodes of the SRAM cell, and a second local interconnecting portion electrically connecting the gate of the fourth MOS transistor to the drain of the third MOS transistor and the drain of the first load transistor to form the second of the nodes of the SRAM cell.

27. An SRAM cell as recited in claim 26, wherein said local interconnecting structure further comprises a third local interconnnecting portion electrically connecting the gate of the second load transistor to the second of the nodes of the SRAM cell.

* * * * *